United States Patent
Cabuz et al.

(10) Patent No.: US 8,847,143 B2
(45) Date of Patent: Sep. 30, 2014

(54) SYSTEMS AND METHODS FOR AN ENCODER AND CONTROL SCHEME

(75) Inventors: Eugen Cabuz, Eden Prairie, MN (US); Robert D. Horning, Savage, MN (US); Ryan Supino, Loretto, MN (US); Burgess R. Johnson, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 513 days.

(21) Appl. No.: 13/307,432

(22) Filed: Nov. 30, 2011

(65) Prior Publication Data

US 2012/0272730 A1 Nov. 1, 2012

Related U.S. Application Data

(60) Provisional application No. 61/479,783, filed on Apr. 27, 2011.

(51) Int. Cl.
*G01D 5/34* (2006.01)
(52) U.S. Cl.
CPC ........................................ *G01D 5/34* (2013.01)
USPC ....................................................... 250/231.1
(58) Field of Classification Search
USPC .................. 250/231.1–231.13; 356/472–475
See application file for complete search history.

(56) References Cited

U.S. PATENT DOCUMENTS

| | | | | |
|---|---|---|---|---|
| 2,586,540 | A | * | 2/1952 | Holden ..................... 73/862.324 |
| 4,801,206 | A | | 1/1989 | Benoist |
| 6,476,918 | B1 | | 11/2002 | Killpatrick |
| 2002/0027191 | A1 | * | 3/2002 | Min et al. ................. 250/231.13 |

OTHER PUBLICATIONS

"Pulse Width Modulation", Aug. 25, 2000, pp. 1-3, Publisher: Axiomatic Technologies Corporation.
Siripruchyanun, "A Tempeature-Insensitive VCO and Derivative PWN Signal Generator", "The Journal of KMITNB", Apr. 2002, pp. 1-8, vol. 12, No. 2.
Staebler, "TMS320F240 DSP Solution for Obtaining Resolver Angular Position and Speed", Feb. 2000, pp. 1-23, Publisher: Texas Instruments.
Wenqi, Abstract of "Decoder of Dithered Laser Gyro and Micro Angular Rate Measurement", "Journal of Chinese Inertial Technology", Mar. 1996, pp. 1-3, Publisher: Tsinghua Tongfang Knowledge Network Technology Co., Ltd.

* cited by examiner

*Primary Examiner* — Seung C Sohn
(74) *Attorney, Agent, or Firm* — Fogg & Powers LLC

(57) ABSTRACT

Systems and methods for an encoder and control scheme are provided. In one embodiment, a micro-electromechanical system (MEMS) device comprises: a stator having a first marker and a second marker arranged on a surface of the stator to form a sensing pattern; a sweeping element that dithers in a plane parallel to the surface of the stator along a sweep path that crosses the first marker and a second marker; an overlap sense circuit operable to measure an area overlap between the sweeping element and the sensing pattern, wherein the overlap sense circuit generates a pulse train signal output that varies as a function of the area overlap.

20 Claims, 10 Drawing Sheets

SYSTEMS AND METHODS FOR AN ENCODER AND CONTROL SCHEME

This application claims the benefit of U.S. Provisional Application No. 61/479,783, filed on Apr. 27, 2011, which is incorporated herein by reference in its entirety.

BACKGROUND

A rotary encoder is a device used to precisely measure an angle of rotation in a rotational stage of a micro-electromechanical system (MEMS) device. One problem with encoder devices currently available is that they tend to produce a drift error due to physical expansions and shrinkage in structure due to changes in temperature conditions.

For the reasons stated above and for other reasons stated below which will become apparent to those skilled in the art upon reading and understanding the specification, there is a need in the art for methods and systems for an encoder and control scheme.

SUMMARY

The embodiments of the present invention provide methods and systems for an encoder and control scheme and will be understood by reading and studying the following specification.

In one embodiment, a micro-electromechanical system (MEMS) device comprises: a stator having a first marker and a second marker arranged on a surface of the stator to form a sensing pattern; a sweeping element that dithers in a plane parallel to the surface of the stator along a sweep path that crosses the first marker and a second marker; an overlap sense circuit operable to measure an area overlap between the sweeping element and the sensing pattern, wherein the overlap sense circuit generates a pulse train signal output that varies as a function of the area overlap.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

Figure 1:
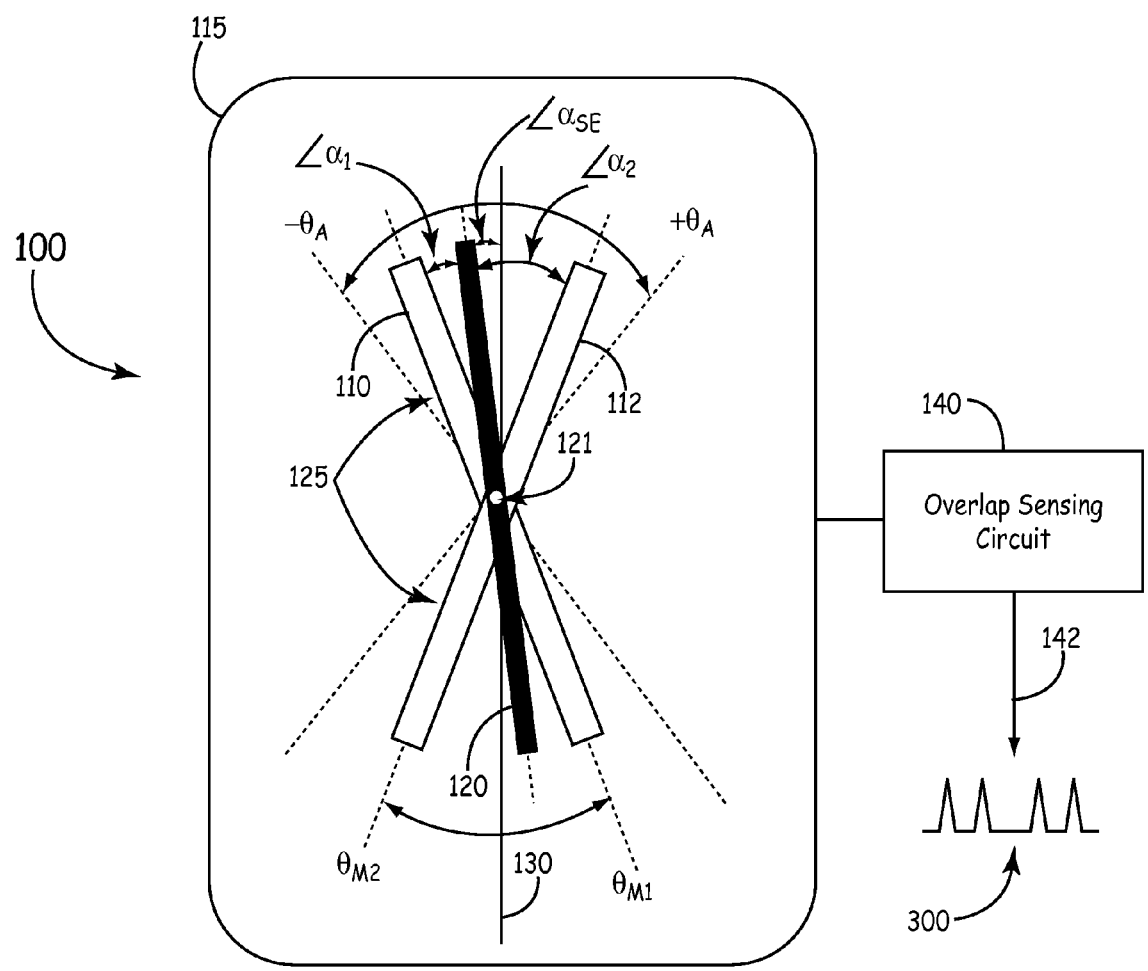
FIG. 1 is a diagram illustrating an encoder of one embodiment of the present invention.

FIG. 1 is a diagram illustrating an encoder 100 of one embodiment of the present invention. In the embodiment of FIG. 1, encoder 100 is a rotary decoder comprising a first member that functions as a stator 115 and a sweeping element 120 that dithers in a plane parallel to stator 115 about axis 121. Because the sweep path traveled by sweeping element 120 is a rotary sweep path, sweeping element 120 for such an embodiment is also referred to herein as rotor 120. Stator 115 includes a first marker 110 and a second marker 112 which are utilized by encoder 100 in detecting and controlling the amplitude of the angle of sinusoidal dithering of rotor 120.

Figure 2:
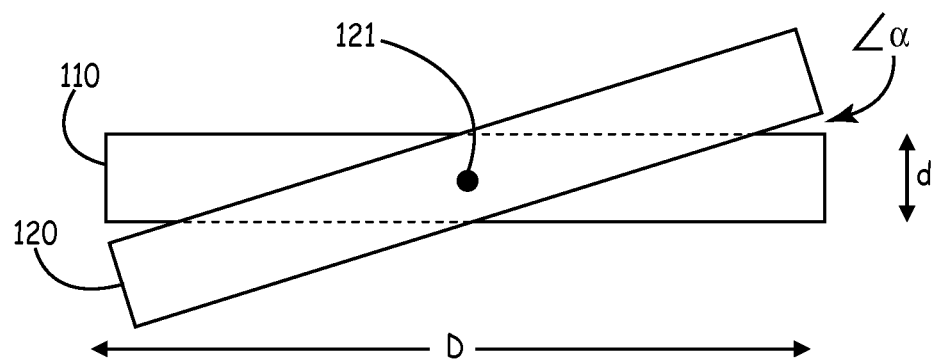
FIG. 2 is a diagram illustrating an encoder of one embodiment of the present invention.

To provide a simplified explanation, the interaction between first marker 110 and rotor 120 are first discussed with reference to FIG. 2. For this particular embodiment, marker 110 and rotor 120 are both rectangular in shape having dimensions of "d" in width and "D" in length. Marker 110 and rotor 120 and are arranged and aligned such that axis 121 passes through the center points of both marker 110 and rotor 120. As rotor 120 rotates about axis 121, the area "A" of overlap between the two elements changes as a function of angular rotation α such that:

$$A = \begin{cases} dD - \dfrac{D^2}{4}\sin\alpha & 0 < \alpha < \dfrac{2d}{D} \\ \dfrac{d^2}{\sin\alpha} & \dfrac{2d}{D} < \alpha < \theta_A \end{cases} \quad \text{(Eq. 1)}$$

where $\theta_A$ is the amplitude of rotation. This function for area is symmetric for positive and negative values of α. That is, as sweeping element 120 is dithered in angle α between $-\theta_A$ and $+\theta_A$, the area, A, of overlap between element 120 and marker 110 will vary as a function of α, having a peak in value when they are directly aligned and the angle between the two is zero (α=0).

Returning to FIG. 1, the first marker 110 and second marker 112 are both identical in dimensions and both centered about axis 121 but are offset in rotation with respect to each other by the precisely known angle of θ to form an "X" sensing pattern (shown generally at 125) on stator 115. Continuing from the discussion above with respect to FIG. 2, an area $A_1$ of overlap between rotor 120 and first marker 110 will follow equation Eq. 1 as a function of angular rotation $\alpha_1$. In the same way, and area $A_2$ of overlap between rotor 120 and second marker 112 will also follow equation Eq. 1 as a function of angular rotation $\alpha_2$. The total area of overlap $A_T$ between rotor 120 and the sensing pattern 125 formed by the markers 110 and 112 could therefore readily be expressed as function of angular rotation $\alpha_{SE}$ of rotor 120 with respect to axis of symmetry 130. Each time rotor 120 passes over either marker 110 or maker 112, a peak in total overlapping area $A_T$ occurs. A minimum in total overlapping area $A_T$ occurs when rotor 120 is rotated to an angular position $\alpha_{SE}=0$ directly between markers 110 and 112. When the angular positions of markers 110 and 112 are known, encoder 100 thus provides a precision means for detecting when rotor 120 is aligned with these markers and the precise angular rotation $\alpha_{SE}$ of rotor 120 during those instances of time.

Figure 1A:
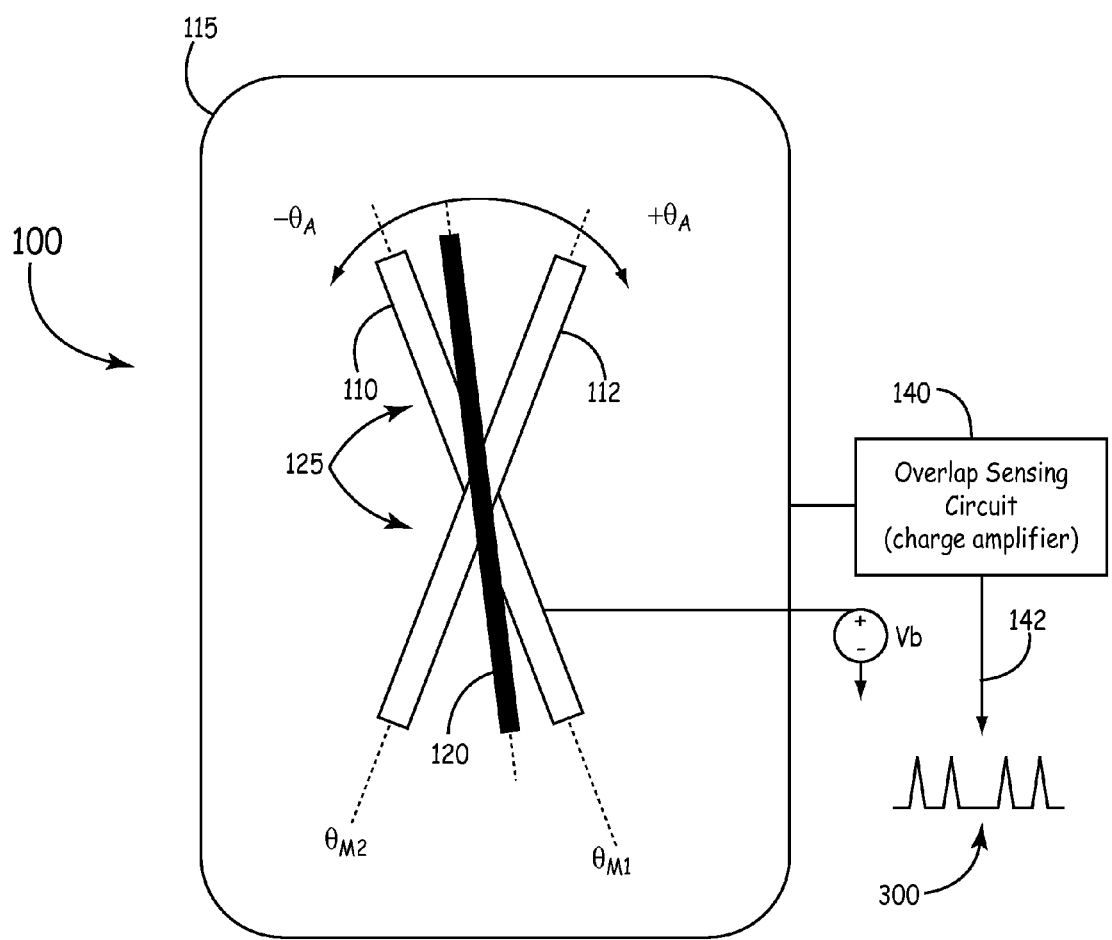
FIG. 1A is a diagram illustrating an encoder of one embodiment of the present invention.

In one embodiment, a value for the overlapping area $A_T$ is measured using overlap sensor circuit 140. In one embodiment, overlap sensor circuit 140 generates a signal representing total overlapping area $A_T$ by capacitive detection. In one such embodiment (shown by FIG. 1A), rotor 120 and markers 110, 112 are each metallic strips with a bias voltage Vb applied to the "X" sensing pattern 125 and the sensing circuit 140 designed as a charge amplifier. As the rotor 120 is dithered at the amplitude of $\theta_A$, the output from the charge amplifier/overlap sensor circuit 140 will peak each time the rotor passes over one of the markers 110, 112.

Figure 3:
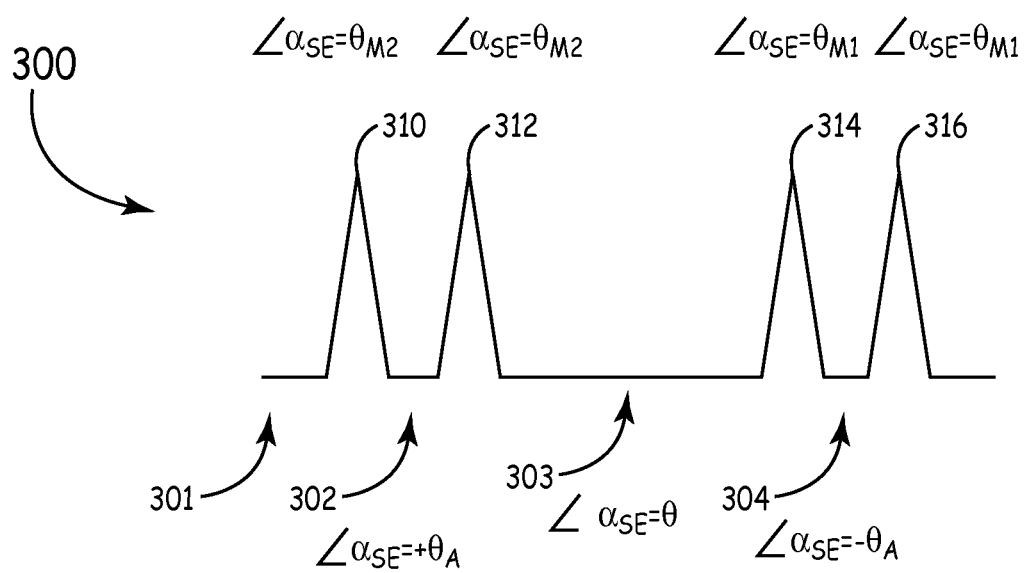
FIG. 3 is a diagram illustrating a pulse train signal output from encoder of one embodiment of the present invention.

FIG. 3 illustrates a signal generally at 300 representing the output 142 from overlap sensor circuit 140. In operation, starting at position 301, when rotor 120 rotates clockwise to approach and pass over marker 112, the capacitance measurement signal will rapidly increase to form a pulse (shown at 310), peaking when rotor 120 and marker 212 have their greatest overlap and falling as element 120 continues clockwise past marker 112. When the angular rotation $\alpha_{SE}$ reaches $+\theta_A$ (shown at position 302), rotor 120 is driven to rotate back in the counter-clockwise direction. Rotor 120 again passes over marker 112 and the capacitance measurement signal 300 will again form a pulse (as shown at 312) peaking when rotor 120 and marker 112 have the greatest overlap and then falling as element 120 continues to rotate counter-clockwise.

As rotor 120 continues counter-clockwise past $\alpha_{SE}=0$ (shown at 303), it will pass over the first marker 110, and the signal 300 will pulse (shown at 314), peaking when rotor 120 and marker 210 have their greatest overlap and falling once rotor 120 passes second marker 110.

When the angular rotation $\alpha_{SE}$ reaches $-\theta_A$ (shown at position 304), rotor 120 is driven to rotate back in the clockwise direction. Rotor 120 once again passes over marker 110 and the signal 300 will again pulse (shown at 316), peaking when rotor 120 and marker 210 have the greatest overlap. The resulting signal 300 forms a pulse train signal 300 where each pulse represent an maximum in total overlapping area $A_T$ between rotor 120 and the X sensing pattern 125 formed by markers 110 and 112.

Figure 4:
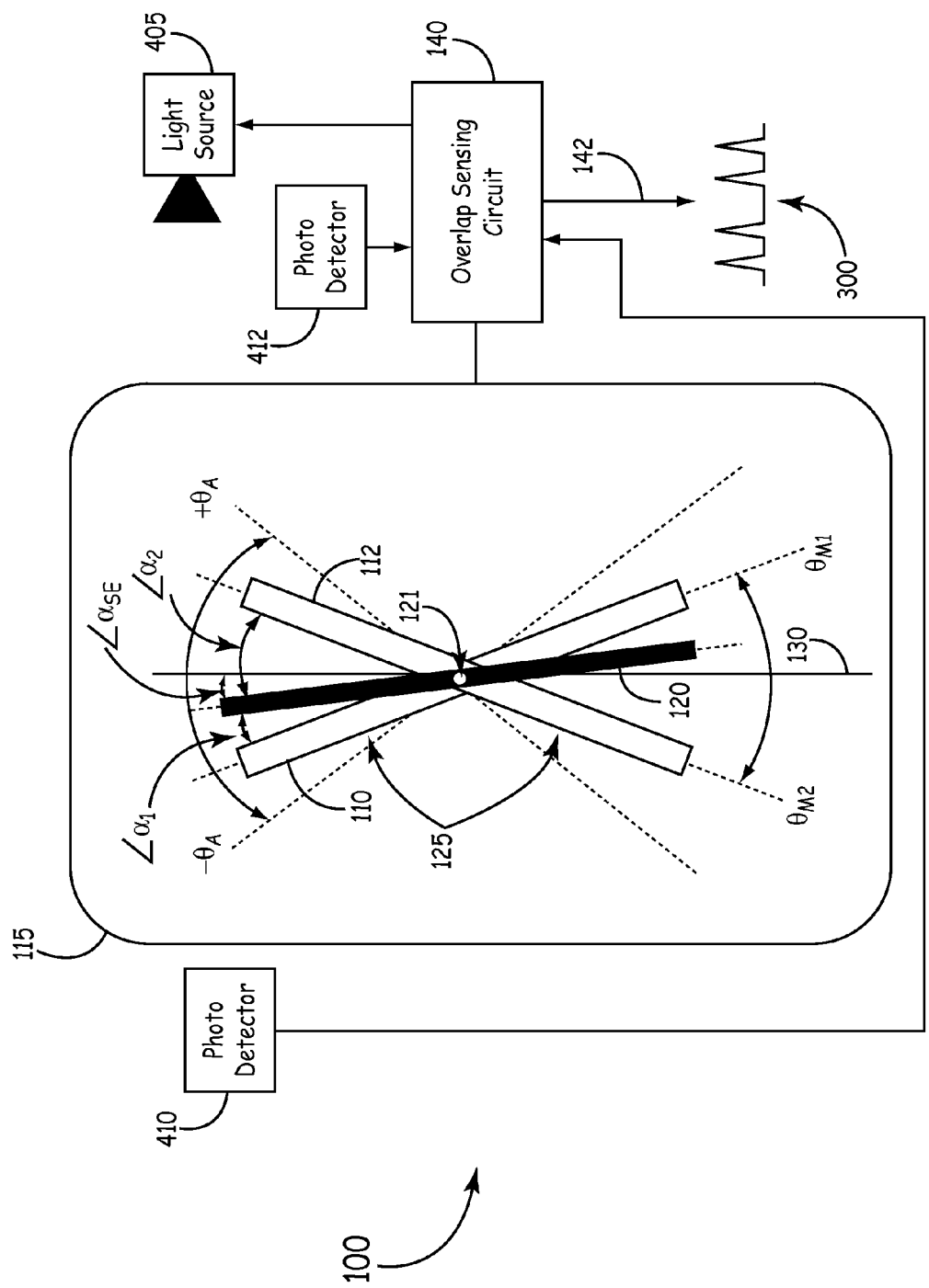
FIG. 4 is a diagram illustrating an encoder of one embodiment of the present invention.

Although the above describes generation of pulse train signal 300 based on capacitance measurements, in other embodiment, overlap sensing circuit 140 uses other proxy measurements for detecting the total overlapping area $A_T$ between rotor 120 and markers 110 and 112 to generate pulse train signal 300. Such alternates are contemplated as within the scope of embodiments of the present invention. For example, in one alternate embodiment, encoder 100 employs optics to detect the overlap. One such example is shown in FIG. 4 where overlap sensing circuit 140 further includes a light source 405 and photo-detector 410. In this configuration, rotor 120 and markers 110 and 112 are within in the optical path between light source 405 and photo-detector 410 and thus partially obstruct light from reaching photo-detector 410. When rotor 120 reaches a local maximum of overlap with either marker 110 or 112, a peak in the in the amount of light reaching photo-detector 410 will occur. Thus, the output of photo-detector will generate a pulse train signal with peaks that indicates the position of rotor 120 in the same manner as shown by pulse train signal 300. Embodiments based on reflectance of light, rather than obstruction of light, are also contemplated. For example, in one embodiment device 100 further (or alternately) includes a photo-detector 412 that measures light reflected from stator 115. There, stator 115 may include a reflective surface that is partially covered by non-reflective markers 110, 112 and rotor 120. As such, when rotor 120 is dithered as described above, photo-detector 412 will output a signal indicating peaks of reflected light where rotor 120 is aligned with markers 110, 112.

Regardless of the means used by overlap sensor circuit 150 to generate pulse train signal 300, the peaks at 310, 312, 314 and 316 precisely indicate when rotor 120 is rotated to a position aligned with either marker 110 or marker 120. As would be evident to one of ordinary skill in the art after studying this disclosure, in still other embodiments, additional markers in other patterns may be placed onto a stator and a pulse train signal utilized to detect when overlapping peaks.

Figure 5:
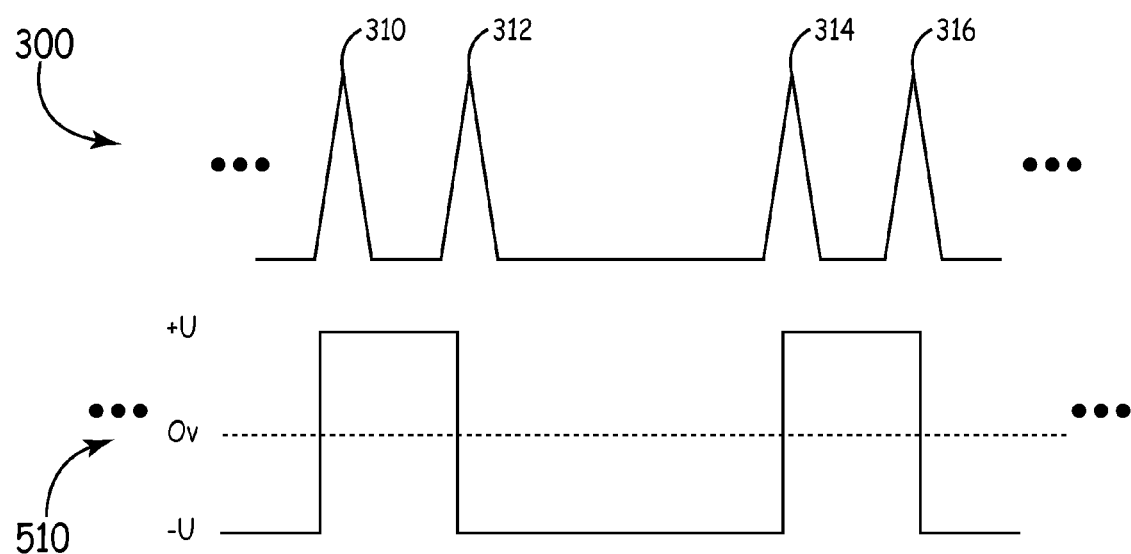
FIG. 5 is a diagram illustrating a pulse train signal output from encoder with a pulse width modulation of the pulse train signal output for one embodiment of the present invention.

From pulse train signal 300, one or more embodiments of the present invention generate a +/− pulse width modulation signal which is controlled to an average value of zero volts by controlling $\theta_A$, the amplitude of oscillation of rotor 120. That is, the pulse width modulation signal toggles between two values every time a pulse occurs in the pulse train signal 300. One such pulse width modulation signal 510 is illustrated in FIG. 5 aligned in time with pulse train signal 300. Each time pulse train signal 300 peaks at 310, 312, 314 and 315, pulse width modulation signal 510 will toggle between the values of +U and −U. For example, in one embodiment, when a point on the leading edge of peak 310 is detected, pulse width modulation signal 510 toggles from −U to +U indicating that rotor 120 has rotated clockwise past marker 212. When rotor 120 returns past marker 212 in the counter-clockwise direction, the leading edge of peak 312 is detected and pulse width modulation signal 510 toggles from +U to −U. Then when the leading edge of peak 314 is detected, pulse width modulation signal 510 toggles from −U to +U indicating that rotor 120 has rotated counter-clockwise past marker 210. When rotor 120 returns past marker 210 in the clockwise direction, the leading edge of peak 316 is detected and pulse width modulation signal 510 toggles from +U to −U.

The occurrence of toggling in pulse width modulation signal 510 between +U and −U thus indicates when rotor 120 is at an angular rotation $\alpha$ equal to that of one of the markers 110, 112. Further the value of pulse width modulation signal 510 indicates whether the angular rotation $\alpha_{SE}$ is greater absolute value than the respective angular positions $\theta_{M1}$, $\theta_{M2}$ of markers 110, 112. That is, in FIG. 5, pulse width modulation signal 510 has a value of −U when rotor 120 is between either of markers 110, 112 and $\alpha_{SE}=0$ (i.e., $|\theta_{M1}|>|\alpha_{SE}|<|\theta_{M2}|$). Pulse width modulation signal 510 has a value of +U when rotor 120 is between marker 110 and $\alpha=-\theta_A$, (i.e., $|\theta_{M1}|<|\alpha_{SE}|$) or between marker 112 and $\alpha=+\theta_A$ (i.e., $|\theta_{M2}|<|\alpha_{SE}|$).

As dithering amplitude of rotor 120 is increased, the duty cycle of pulse width modulation signal 510 will approach 50%, which occurs when the value of signal 510 is at +U for a period of time equal to when the value of signal is at −U. A duty cycle of 50% will occur precisely when rotor 120 is driven to an amplitude of rotation $\theta_A$ equal to the square root of two times $\theta_M$, ($\theta_A = \sqrt{2} \times \theta_M$), where $\theta_M$ is the angular position of markers 110, 112.

Figure 6:
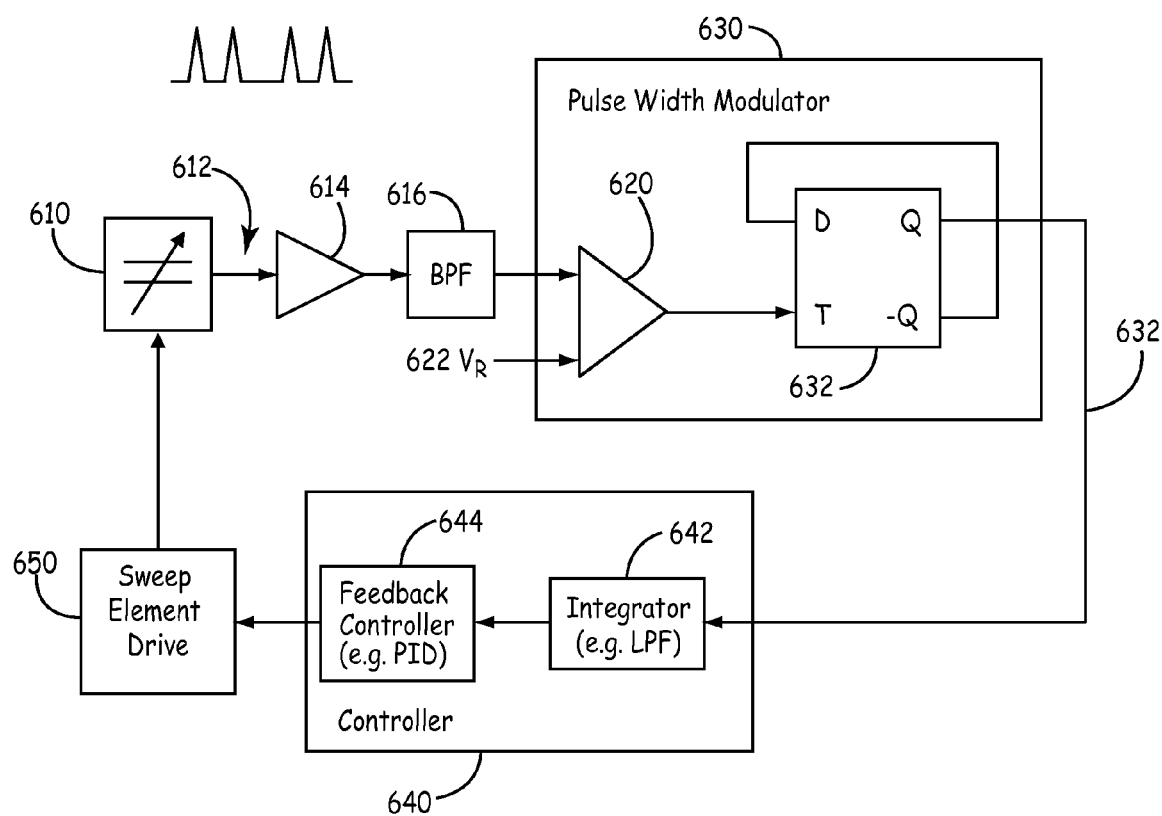
FIG. 6 is a diagram illustrating a dithering measurement and control circuit for an encoder of one embodiment of the present invention.

FIG. 6 illustrates a dither control circuit 600 of one embodiment of the present invention. Dither control circuit 600 comprises an encoder 610, such as rotary encoder 100, that produces a pulse train signal output 612, such as pulse train signal 300. For example, in one embodiment the pulse train signal is the result of a transimpedance amplifier hooked up to a capacitive encoder.

The pulse train signal output 612 is then provided to a pulse-width modulator 630 which produces the pulse width modulation signal 632 (such as pulse width modulation signal 500). In one embodiment, a comparator 620 receives pulse train signal output 612 (which in some embodiments may be optionally amplified by an amplifier 614 (such as a transimpedance amplifier) and/or filtered by band pass filter 616) and compares the level of pulse train signal output 612 against a reference value ($V_R$ shown at 622) in order to detect leading edges of peaks (such as 310, 312, 314 and 316). In the particular embodiment of FIG. 6, pulse-width modulator 630 is implemented using a T flip-flop 632 that is configured to change states and toggle the polarity of its output between positive and negative each time comparator 620 detects a leading edge of a pulse in pulse train signal output 612. In one embodiment, the polarity and toggle points provided by the pulse width modulation signal 632 can then be used, for example, to determine the position of rotor 120 with respect to markers 110 and 112.

In one embodiment, the pulse width modulation signal 632 is also utilized to control the dithering of encoder 610. The pulse width modulation signal 632 is fed back to a controller 640, which in the embodiment of FIG. 6 further comprises an integrator 642 and a feedback controller 644. In one embodiment, feedback controller 644 is implemented using a proportional-integral-derivative controller (PID controller), for example. In one embodiment, integrator 642 is implemented using a low pass filter (LPF) device. The output of controller 640 feeds sweeping element drive 650, which in turn controls the angle amplitude of encoder 610.

In operation, integrator 642 performs a summation of pulse width modulation signal 632. When the net sum output of integrator 640 is non-zero, that means the duty cycle of pulse width modulation signal 632 is either less than or greater than a 50% duty cycle. A non-zero net sum output of integrator 640 indicates either 1) that the pulse width modulation signal 632 is toggled to a + value for a longer period per cycle than a − value, or 2) that pulse width modulation signal 632 is toggled to a − value for a longer period per cycle than a + value. Feedback controller 644 receives as its input the net sum output of integrator 640. Using that input, in one embodiment, feedback controller 644 adjusts sweeping element drive 650 to obtain a zero net sum output from integrator 640. In an embodiment where encoder 610 is the encoder 100 of FIG. 1, controller 644 will adjust rotor drive 650 to obtain a zero output from integrator 642. At that point, rotor 120 will have an amplitude of rotation $\theta_A = \sqrt{2} \times \theta_M$, where $\theta_M$ is the angular position of markers 110, 112. At that amplitude of rotation, pulse width modulation signal 632 will have the desired 50% duty cycle. It should be understood that for some embodiments, fine control of the dithering amplitude can be achieved by providing a non-zero reference to the feedback controller 644 rather than a zero reference.

An encoder having radial symmetry, such as encoder 110, has the advantage of maintaining precision under changing thermal conditions. That is, when changing thermal conditions cause components of encoder 110 to expand or contract, the rotor 120 and markers 110, 112 will do so in a radial nature, which will not alter the angle between markers 110 or 112 or the position of rotor 120 with respect to markers 110, 112. For this reason, the amplitude of rotation $\theta_A$ needed to produce a 50% duty cycle does not change due to thermal expansion or contraction of encoder 110. Similarly, rotor 120 rotates in a plane some gap distance above the plane of markers 110, 112. If this gap distance changes due to relatively slowly varying changes in thermal conditions, the amplitude value of pulses in pulse train signal 300 may change, but the distance in time between the pulses will remain the same. Accordingly, the resulting pulse width modulation signal 510 will not be affected by changes in thermal conditions. Further, controlling dithering of an encoder to a 50% duty cycle also allows for canceling out of other geometrical changes that could cause amplitude problems.

Figure 7:
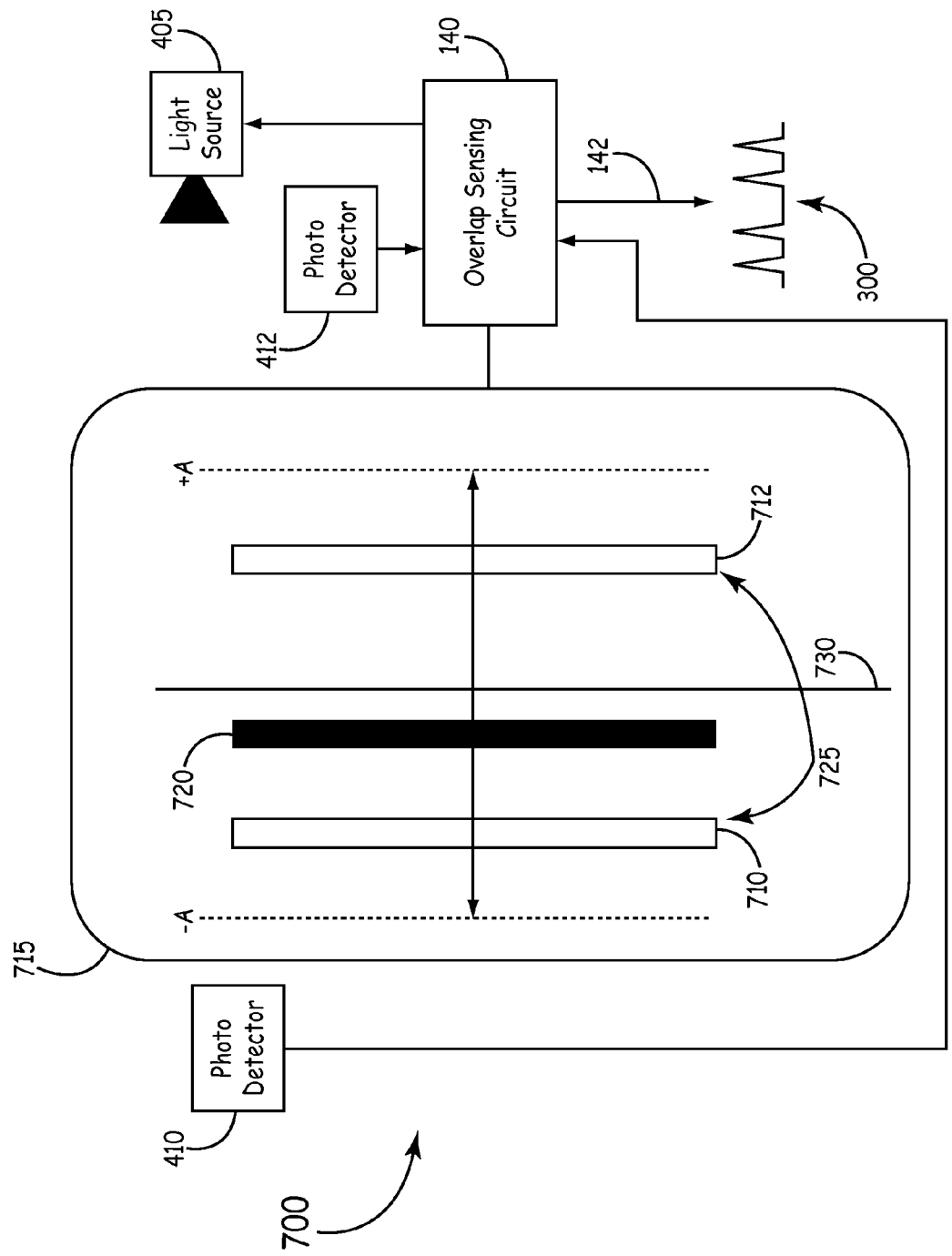
FIG. 7 is a diagram illustrating an encoder of one embodiment of the present invention.

FIG. 7 illustrates another embodiment where an encoder 700 dithers along a linear sweep path 702 in the plane parallel to the stator 715. The first marker 710 and the second marker 712 are oriented parallel to each other along the linear sweep path 702. In the same way described above with respect to encoder 100, at sweeping element 720 dithers along sweep path 702 from −A to +A, the area overlap between sweeping element 720 and the sensing pattern 725 formed by markers 710 and 712 will vary such that overlap sensing circuit 140 will again produce a pulse train signal 300 where the pulses indicate instances of maximum overlap. As above, in one alternate embodiment, overlap sensing circuit 140 can use capacitance to determine overlap between the sweeping element 720 and the sensing pattern 725. In another alternate embodiment, overlap sensing circuit 140 can further comprise one or more photo-detectors 410, 412 and a light source 405 to determine overlap using optics as described above in FIG. 4. Pulse train signal 300 can then be processed to produce a pulse width modulated signal as describe with respect to FIGS. 5 and 6.

As described in FIG. 1-7 above, embodiments of the present invention enable precise control of micro-element dithering using rotary motion or linear motion in micro-scale devices such as micro-electromechanical systems (MEMS). There are various applications for such precision control of micro-elements within a MEMS which are contemplated as within the scope of embodiments of the present invention. For example, in one embodiment FIG. 8A illustrates a device 801 that includes MEMS elements. An encoder 910 (which in some embodiments can be encoder 100 or encoder 700, for example) is physically coupled to a mirror 820 to provide for precision mirror dithering. For example, in one such embodiment either a direct or indirect linkage between sweeping element 120 or 720 and mirror 820 precisely controls mirror 820 positioning within a MEMS device 801. In one embodiment, encoder 810 is monitored and controlled using a dither control circuit comprising a pulse width modulator 630, controller 640 and sweep element drive 650 such as described above with respect to FIG. 6.

Figure 8B:
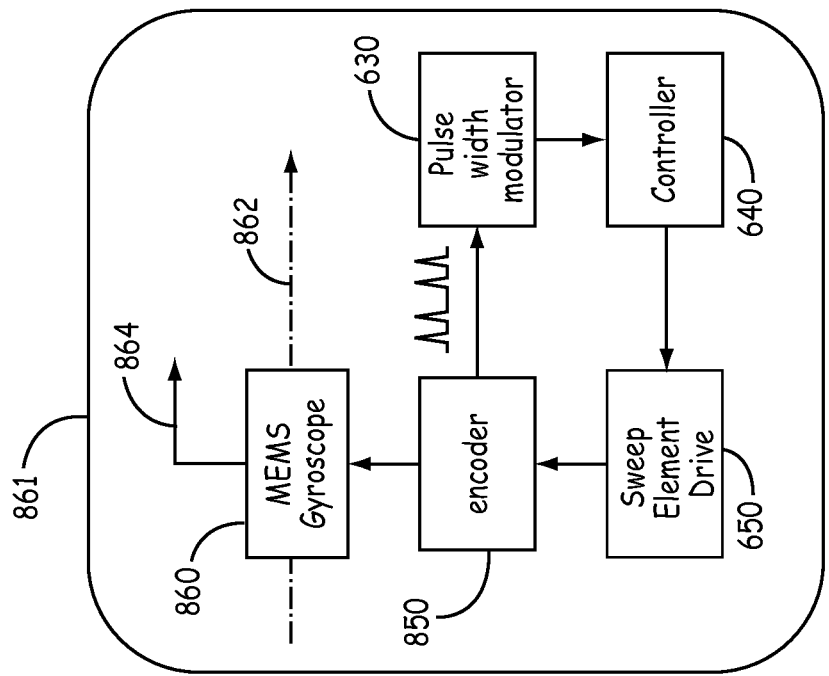
FIGS. 8A and 8B are a diagrams illustrating MEMS devices that incorporate an encoder of one embodiment of the present invention.
Figure 8A:
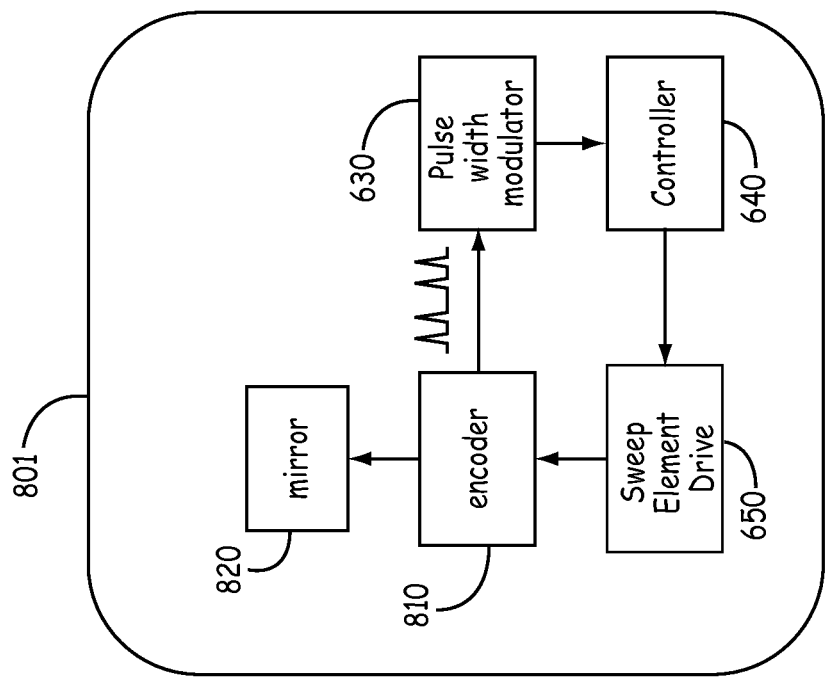

Another embodiment of a device 861 including MEMS elements is illustrated in FIG. 8B. An encoder 850 (which in some embodiments can be encoder 100 or encoder 700, for example) is utilized to eliminate sensor bias by dithering the input axis of a MEMS gyroscope 860. For example, in one embodiment, gyroscope 860 measures rotation about an input axis 862. A sensor bias error is always present in the rotational measurement output of gyroscope 860. This sensor bias error is independent if where the gyroscope is pointing. By dithering the orientation of input axis 862 at a known dithering frequency, the change in the gyroscope's output 864 actually caused by rotational motion of device 861 is dithered at the dithering frequency. Sensor bias error, however, is not dithered because the error is independent of orientation. This permits separation of the real rotational data from the bias error by demodulating the dithered signal output 865 based on the dithering frequency. In one embodiment, encoder 850 is monitored and controlled using a dither control circuit comprising a pulse width modulator 630, controller 640 and sweep element drive 650 such as described above with respect to FIG. 6.

Figure 9:
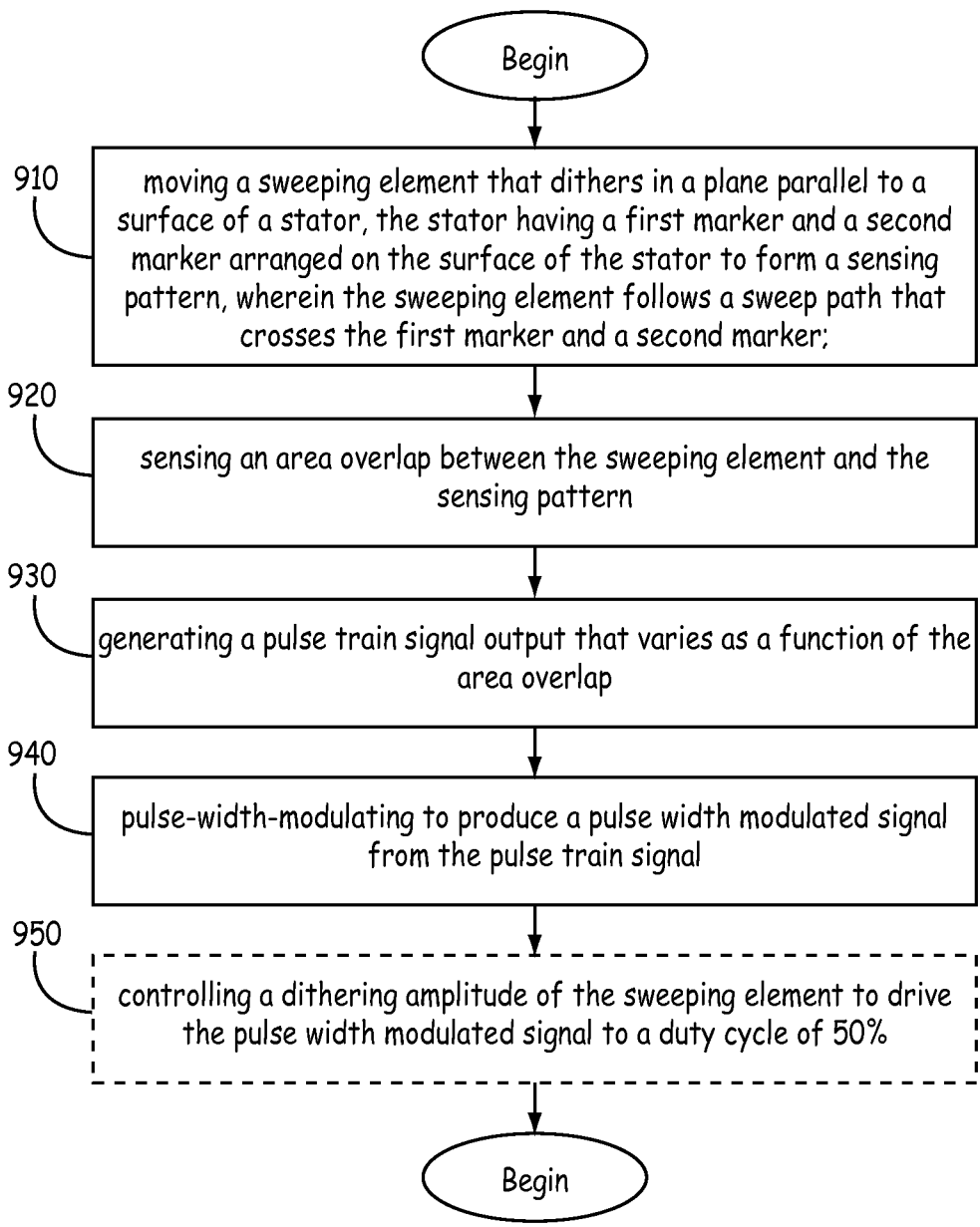
FIG. 9 is a flow chart of a method of one embodiment of the present invention.

FIG. 9 is a flow chart illustrating a method for controlling dithering in a micro-electrical mechanical system (MEMS) device. The method of FIG. 9 in one or more embodiments can be applied to any of the structures described above with respect to FIGS. 1-7 and 8A, 8B. The method begins at 910 with moving a sweeping element that dithers in a plane parallel to a surface of a stator, the stator having a first marker and a second marker arranged on the surface of the stator to form a sensing pattern, wherein the sweeping element follows a sweep path that crosses the first marker and a second marker. In one embodiment, the sweeping element is a rotor that dithers in angle in the plane parallel to the stator about an axis and the first marker and the second marker form an X sensing pattern centered at the axis. The rotary encoder 100 as illustrated in FIG. 1 above provides an example of one such embodiment. In another embodiment, the sweeping element dithers along a linear sweep path in the plane parallel to the stator and the first marker and the second marker are oriented parallel to each other along the linear sweep path. The linear encoder 700 as illustrated in FIG. 7 above provides an example of one such embodiment.

The method next proceeds to 920 with sensing an area overlap between the sweeping element and the sensing pattern. There are alternate means available for sensing the area overlap, and as described above include, but are not limited to, optical and capacitive sensing.

The method proceeds to 930 with generating a pulse train signal output that varies as a function of the area overlap. In one embodiment, where capacitive sensing is used at block 820, the pulse train signal is generated as a function of capacitance between the sweeping element and the sensing pattern. In one embodiment, where optical sensing is used at block 820, the pulse train signal is generated as a function of light from a light source as received by at least one photo-detector.

The method proceeds to 940 with pulse-width-modulating to produce a pulse width modulated signal from the pulse train signal. In one embodiment, pulse-width-modulating is performed using a pulse width modulator such as pulse width modulator 610 describe above with respect to FIG. 6. The pulse train signal is provided to the pulse-width modulator which produces the pulse width modulation signal (such as pulse width modulation signal 500). In one embodiment, the pulse width modulator comprises a comparator that receives the pulse train signal output and compares the level of the pulse train signal output against a reference value in order to detect leading edges of peaks (such as 310, 312, 314 and 316). In one embodiment a flip-flop is configured to change states and toggle a polarity of its output between positive and negative each time the comparator detects a leading edge of a pulse in the pulse train signal. The polarity and toggles points provided by the pulse width modulation signal can then be used to determine the position of the sweeping element with respect to the first and second markers.

In one embodiment, the method optionally proceeds to 950 with controlling a dithering amplitude of the sweeping element to drive the pulse width modulated signal to a duty cycle of 50%. This, in one embodiment, is performed as described above with respect to FIG. 6. That is, the pulse width modulation signal is fed back to a controller which can include an integrator and a feedback controller (such as a proportional-integral-derivative controller—PID controller, for example). The integrator can be implemented using a low pass filter device. The output of the controller feeds a sweeping element drive, which in turn controls the angle amplitude (and optionally the dithering rate) of the sweeping element.

In operation, the integrator performs a summation of the pulse width modulation signal and the feedback controller drives the sweeping element drive in order to obtain a zero net sum output from the integrator. When the net sum output of the integrator is non-zero, that means the duty cycle of the pulse width modulation signal is either less than or greater than a 50% duty cycle. When the net sum output of the integrator is zero, the pulse width modulation signal will have the desired 50% duty cycle.

Several means are available to implement the systems and methods of the current invention as discussed in this specification. For example, the pulse width modulators, controllers, overlap sensing circuits, can be realized through discrete electronics, digital computer systems, digital signal processors, microprocessors, programmable controllers and field programmable gate arrays (FPGAs) or application-specific integrated circuits (ASICs). Therefore other embodiments of the present invention are program instructions resident on computer readable media which when implemented by such means enable them to implement embodiments of the present invention. Computer readable media are any form of a physical computer memory storage device. Examples of such a physical computer memory device include, but is not limited to, punch cards, magnetic disks or tapes, optical data storage system, flash read only memory (ROM), non-volatile ROM, programmable ROM (PROM), erasable-programmable ROM (E-PROM), random access memory (RAM), or any other non-transitory form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A micro-electromechanical system (MEMS) device, the device comprising:
   a stator having a first marker and a second marker arranged on a surface of the stator to form a sensing pattern;
   a sweeping element that dithers in a plane parallel to the surface of the stator along a sweep path that crosses the first marker and a second marker; and
   an overlap sense circuit operable to measure an area overlap between the sweeping element and the sensing pattern, wherein the overlap sense circuit generates a pulse train signal output that varies as a function of the area overlap.

2. The device of claim 1, wherein the sweeping element is a rotor that dithers in angle in the plane parallel to the stator about an axis, and the first marker and the second marker form an X sensing pattern centered at the axis.

3. The device of claim 1, wherein the sweeping element dithers along a linear sweep path in the plane parallel to the stator, and the first marker and the second marker are oriented parallel to each other along the linear sweep path.

4. The device of claim 1, wherein the overlap sense circuit is electrically coupled to the first marker, the second marker and the sweeping element; and
   wherein the overlap sense circuit measures a capacitance between the sweeping element and the sensing pattern to generate the pulse train signal that varies as a function of the area overlap.

5. The device of claim 1, wherein the overlap sense circuit further comprises:
   a light source; and
   at least one photo-detector;

wherein the pulse train signal output is generated as a function of light from the light source received by the at least one photo-detector.

6. The device of claim 1, wherein the sweeping element is linked to a MEMS gyroscope device such that dithering of the sweeping element causes dithering of an orientation of an input axis of the MEMS gyroscope.

7. The device of claim 1, wherein the sweeping element is linked to a mirror device such that dithering of the sweeping element causes the mirror to vary in position.

8. The device of claim 1, further comprising:
a pulse width modulator that inputs the pulse train signal of the overlap sense circuit and produces a pulse width modulated signal from the pulse train signal.

9. The device of claim 8, wherein the pulse width modulator further comprises:
a comparator that compares a level of the pulse train signal to a threshold; and
a flip-flop coupled to the comparator; and
wherein the pulse width modulated signal is generated from the output of the flip-flop.

10. The device of claim 8, further comprising:
a controller coupled to the pulse width modulator and receiving the pulse width modulated signal; and
a sweep element drive coupled to the controller;
wherein based on an output of the controller, the sweep element drive controls a dithering amplitude of the sweeping element.

11. The device of claim 10, wherein the controller adjusts the sweep element drive to drive the pulse width modulated signal towards a specified duty cycle.

12. The device of claim 10, wherein the controller further comprises:
an integrator that receives and integrates the pulse width modulated signal; and
a feedback controller that generated the output of the controller;
wherein the feedback controller controls the output of the controller to drive an output of the integrator towards zero.

13. The device of claim 12, wherein the feedback controller is a proportional-integral-derivative (PID) controller.

14. A dithering method for a controlling a micro-electro-mechanical system (MEMS) device, the method comprising:
moving a sweeping element that dithers in a plane parallel to a surface of a stator, the stator having a first marker and a second marker arranged on the surface of the stator to form a sensing pattern, wherein the sweeping element follows a sweep path that crosses the first marker and a second marker;
sensing an area overlap between the sweeping element and the sensing pattern,
generating a pulse train signal output that varies as a function of the area overlap; and
pulse-width-modulating to produce a pulse width modulated signal from the pulse train signal.

15. The method of claim 14, further comprising:
controlling a dithering amplitude of the sweeping element to drive the pulse width modulated signal to a specified duty cycle.

16. The method of claim 14, wherein the sweeping element is a rotor that dithers in angle in the plane parallel to the stator about an axis and the first marker and the second marker form an X sensing pattern centered at the axis.

17. The method of claim 14, wherein the sweeping element dithers along a linear sweep path in the plane parallel to the stator and the first marker and the second marker are oriented parallel to each other along the linear sweep path.

18. The method of claim 14, wherein the overlap sense circuit is electrically coupled to the first marker, the second marker and the sweeping element; and
wherein the pulse train signal is generated as a function of capacitance between the sweeping element and the sensing pattern.

19. The method of claim 14, wherein the pulse train signal is generated as a function of light from a light source as received by at least one photo-detector.

20. The method of claim 14, wherein the sweeping element is linked to a MEMS gyroscope device such that dithering of the sweeping element causes dithering of an orientation of an input axis of the MEMS.

* * * * *